(12) United States Patent
Newman et al.

(10) Patent No.: US 10,790,144 B2
(45) Date of Patent: Sep. 29, 2020

(54) METHOD TO PRODUCE PYRITE

(71) Applicants: Nathan Newman, Tempe, AZ (US);
Mahmoud Vahidi, Tempe, AZ (US);
Stephen Lehner, Tempe, AZ (US);
Peter Buseck, Tempe, AZ (US)

(72) Inventors: Nathan Newman, Tempe, AZ (US);
Mahmoud Vahidi, Tempe, AZ (US);
Stephen Lehner, Tempe, AZ (US);
Peter Buseck, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 3 days.

(21) Appl. No.: 14/900,307

(22) PCT Filed: Jun. 23, 2014

(86) PCT No.: PCT/US2014/043568
§ 371 (c)(1),
(2) Date: Dec. 21, 2015

(87) PCT Pub. No.: WO2014/209834
PCT Pub. Date: Dec. 31, 2014

(65) Prior Publication Data
US 2016/0379821 A1    Dec. 29, 2016

(51) Int. Cl.
*H01L 21/00*    (2006.01)
*H01L 21/02*    (2006.01)
(Continued)

(52) U.S. Cl.
CPC .. *H01L 21/02568* (2013.01); *H01L 21/02417* (2013.01); *H01L 21/02614* (2013.01);
(Continued)

(58) Field of Classification Search
CPC ......... H01L 21/02417; H01L 21/02568; H01L 21/02614; H01L 21/02631; H01L 29/04; H01L 29/24
(Continued)

(56) References Cited

U.S. PATENT DOCUMENTS 4,508,590 A * 4/1985 Kaplan .................. C30B 29/02
117/85
4,649,227 A   3/1987 Tributsch et al.
(Continued)

FOREIGN PATENT DOCUMENTS

WO    2012118953 A2    9/2012

OTHER PUBLICATIONS

M. Vahidi et al., "Growth of epitaxial pyrite (FeS2) thin films using sequential evaporation", Acta Materialia 61, pp. 7392-7398 (2013).
(Continued)

*Primary Examiner* — Vongsavanh Sengdara
(74) *Attorney, Agent, or Firm* — Quarles & Brady LLP

(57) ABSTRACT

A method for preparing a device having a film on a substrate is disclosed. In the method, a film is deposited on a substrate. The film includes a single-crystalline or poly-crystalline semiconducting thin film. The single-crystalline or poly-crystalline semiconducting thin film is formed by sequential evaporation of a first and a second element. One example device prepared by the method includes a silicon substrate and a film on the substrate, wherein the film includes semiconducting and single- or poly-crystalline pyrite as the compound.

12 Claims, 13 Drawing Sheets

(51) Int. Cl.
*H01L 29/04* (2006.01)
*H01L 29/24* (2006.01)

(52) U.S. Cl.
CPC ........ *H01L 21/02631* (2013.01); *H01L 29/04* (2013.01); *H01L 29/24* (2013.01)

(58) Field of Classification Search
USPC ........................................................ 257/613
See application file for complete search history.

(56) References Cited

U.S. PATENT DOCUMENTS

| | | | | |
|---|---|---|---|---|
| 5,861,069 | A * | 1/1999 | Lee ..................... | C23C 14/0617 148/512 |
| 6,281,427 | B1 | 8/2001 | Mitsuhiro et al. | |
| 6,527,866 | B1 * | 3/2003 | Matijasevic .......... | C23C 14/087 118/719 |
| 6,635,942 | B2 | 10/2003 | La Vecchia | |
| 2001/0013313 | A1 * | 8/2001 | Droopad ........... | H01L 21/02521 117/200 |
| 2002/0064595 | A1 * | 5/2002 | Nomura ................. | B82Y 10/00 427/131 |
| 2003/0107099 | A1 | 6/2003 | La Vecchia | |
| 2006/0205110 | A1 * | 9/2006 | Pinnow ................ | H01L 45/141 438/102 |
| 2006/0239882 | A1 * | 10/2006 | Seo ........................ | C01B 17/20 423/263 |
| 2008/0179702 | A1 * | 7/2008 | Nasuno ............... | H01L 31/1804 257/458 |
| 2011/0171816 | A1 | 7/2011 | Tompa et al. | |
| 2011/0240108 | A1 * | 10/2011 | Law ....................... | B82Y 30/00 136/255 |
| 2011/0305626 | A1 | 12/2011 | Wadia et al. | |
| 2012/0080774 | A1 | 4/2012 | Nasuno et al. | |
| 2013/0119346 | A1 * | 5/2013 | Huang .................... | C01G 49/12 257/21 |
| 2014/0273295 | A1 * | 9/2014 | Li .......................... | H01L 22/26 438/7 |

OTHER PUBLICATIONS

S. W. Lehner et al., "Defect energy levels and electronic behavior of Ni-, Co-, and As-doped synthetic pyrite (FeS2)", J. Appl. Phys. 111, 083717 (2012) (9 pp.).
T. J. Peshek et al., "Criteria for improving the properties of ZnGeAs2 solar cells", Prog. Photovolt: Res. Appl., 21, pp. 906-917 (2013).
C. Wadia et al., "Materials Availability Expands the Opportunity for Large-Scale Photovoltaics Deployment", Environ. Sci. Technol., 43, pp. 2072-2077 (2009).
C. Hoepfner et al., "Stoichiometry-, phase- and orientation-controlled growth of polycrystalline pyrite (FeS2) thin films by MOCVD", Journal of Crystal Growth 151, pp. 325-334 (1995).
B. Thomas et al., Formation of secondary iron-sulphur phases during the growth of polycrystalline iron pyrite (FeS2) thin films by MOCVD, Journal of Materials Science: Materials in Electronics 9, pp. 61-64 (1998).
M. Birkholz et al., "Sputtering of thin pyrite films", Solar Energy Materials and Solar Cells 27, pp. 243-251 (1992).
G. Willeke et al., "Preparation and electrical transport properties of pyrite (FeS2) single crystals", Journal of Alloys and Compounds, 178, pp. 181-191 (1992).
S. Fiechter et al., "Chemical Vapour Transport of Pyrite (FeS2) With Halogen (Cl, Br, I)", Journal of Crystal Growth 78, pp. 438-444 (1986).
C. De Las Heras et al., "Characterization of Iron Pyrite Thin Films Obtained by Flash Evaporation", Thin Solid Films 199, pp. 259-267 (1991).
C. De Las Heras et al., "Comparison of pyrite thin films obtained from Fe and natural pyrite powder", Applied Surface Science 50, pp. 505-509 (1991).
C. De Las Heras et al., "Structural and microstructural features of pyrite FeS(2-x) thin films obtained by thermal sulfuration of iron", J. Mater. Res., vol. 11, No. 1, pp. 211-220 (1996).
L. Meng et al., "Synthesis of pyrite thin films obtained by thermal-sulfurating iron films at different sulfur atmosphere pressure", Materials Science and Engineering B90, pp. 84-89 (2002).
S. Bausch et al., "Preparation of pyrite films by plasma-assisted sulfurization of thin iron films", Appl. Phys. Lett. 57 (1), pp. 25-27 (1990).
I.J. Ferrer et al., "Preparation of n-Type Doped FeS2 Thin Films", Solid State Communications vol. 89, No. 4, pp. 349-352 (1994).
G. Smestad et al., "Photoactive Thin Film Semiconducting Iron Pyrite Prepared by Sulfurization of Iron Oxides", Solar Energy Materials 20, pp. 149-165 (1990).
G. Willeke et al., "Thin pyrite (FeS2) films prepared by magnetron sputtering", Thin Solid Films 213, pp. 271-276 (1992).
M. Bronold et al., "Thin pyrite (FeS2) films by molecular beam deposition", Thin Solid Films 304, pp. 178-182 (1997).
N. Berry et al., "Atmospheric-Pressure Chemical Vapor Deposition of Iron Pyrite Thin Films", Adv. Energy Mater., 2, pp. 1124-1135 (2012).
D. M. Schleich et al., "Iron pyrite and iron marcasite thin films prepared by low pressure chemical vapor deposition", Journal of Crystal Growth 112, pp. 737-744 (1991).
B. Thomas et al., "Growth of FeS2 (pyrite) thin films on single crystalline substrates by low pressure metalorganic chemical vapour deposition", Journal of Crystal Growth 146, pp. 630-635 (1995).
J. Puthussery et al., "Colloidal Iron Pyrite (FeS2) Nanocrystal Inks for Thin-Film Photovoltaics", J. Am. Chem. Soc., 133, pp. 716-719 (2011).
X. Qiu et al., "Solution-based synthesis of pyrite films with enhanced photocurrent generation", Chem. Commun., 49, pp. 1232-1234 (2013).
D. Y.Wang et al., "Solution-Processable Pyrite FeS2 Nanocrystals for the Fabrication of Heterojunction Photodiodes with Visible to NIR Photodetection", Adv. Mater., 24, pp. 3415-3420 (2012).
C. Wadia et al., "Surfactant-Assisted Hydrothermal Synthesis of Single phase Pyrite FeS2 Nanocrystals", Chem. Mater., 21, pp. 2568-2570 (2009).
S. C. Hsiao et al., "Facile synthesis and characterization of high temperature phase FeS2 pyrite nanocrystals", Materials Letters 75, pp. 152-154 (2012).
S. Seefeld et al., "Iron Pyrite Thin Films Synthesized from an Fe(acac)3 Ink", J. Am. Chem. Soc., 135, pp. 4412-4424 (2013).
P. Berberich et al., "Homogeneous high quality YBa2Cu3O7 films on 3" and 4" substrates", Physica C 219, pp. 497-504(1994).
B. H. Moeckly et al., "Growth of high-quality large-area MgB2 thin films by reactive evaporation", Supercond. Sci. Technol. 19, L21-L24 (2006).
G. Smestad et al., "Formation of Semiconducting Iron Pyrite by Spray Pyrolysis", Solar Energy Materials 18, pp. 299-313 (1989).
B. Meester et al., "Synthesis of Pyrite (FeS2) Thin Films by Low-Pressure MOCVD", Chem. Vap. Deposition, vol. 6, No. 3, pp. 121-128 (2000).
J. G. Massey et al., "Direct Observation of the Coulomb Correlation Gap in a Nonmetallic Semiconductor, Si:B", Phys. Rev. Lett. vol. 75, No. 23, pp. 4266-4269 (1995).
A. L. Efros et al., "Coulomb gap and low temperature conductivity of disordered systems", J. Phys. C: Solid State Phys. vol. 8, L49-L51 (1975).
S. F. Wang et al., "High quality MgB2 thick films and large-area films fabricated by hybrid physical-chemical vapor deposition with a pocket heater", Supercond. Sci. Technol. 21, 085019 (2008) (5 pp.).
A.J. Clayton et al., "MOCVD of ultra-thin PV solar cell devices using a pyrite based p-i-n structure", Glyndŵr University Research Online (2011) (10 pp.).
M. Vahidi, "Growth and characterization of novel thin films for microelectronic applications", PhD Thesis, Arizona State University, Aug. 2013 (97 pp.).
K. Bueker et al., "Photovoltaic output limitation of n-FeS2 (pyrite) Schottky barriers: A temperature-dependent characterization", J. Appl. Phys. 72, pp. 5721-5728 (1992).

(56) References Cited

OTHER PUBLICATIONS

H.A. Macpherson, "Iron Pyrite Nanocubes: Size and Shape Considerations for Photovoltaic Application", ACS Nano, vol. 6, No. 10, pp. 8940-8949 (2012).

C. Steinhagen et al., "Pyrite Nanocrystal Solar Cells: Promising, or Fool's Gold?", J. Phys. Chem. Lett., 3, pp. 2352-2356 (2012).

R. J. Soukup et al., "Formation of pyrite (FeS2) thin films by thermal sulfurization of dc magnetron sputtered iron", J. Vac. Sci. Technol. A, 29, 011001 (2011) (5 pp.).

L. Yu et al., "Iron Chalcogenide Photovoltaic Absorbers", Adv. Energy Mater. 1, pp. 748-753 (2011).

P. Waldner et al., "Thermodynamic Modeling of the Fe—S System", Journal of Phase Equilibria and Diffusion, vol. 26, No. 1, pp. 23-38 (2005).

L. Huang et al., "Pyrite Films Grown by Sulfurizing Precursive Iron of Different Crystallizing Status", J. Mater. Sci. Technol., vol. 25, No. 2, pp. 237-241 (2009).

A. M. Golsheikh et al., "One-pot hydrothermal synthesis and characterization of FeS2 (pyrite)/graphene nanocomposite", Chemical Engineering Journal 218, pp. 276-284 (2013).

M. Akhtar et al., "Deposition of iron sulfide thin films by AACVD from single source precursors", Journal of Crystal Growth 346, pp. 106-112 (2012).

R. J. Bouchard "The Preparation of Single Crystals of FeS2, CoS2 and NiS2 Pyrites by Chlorine Transport", Journal of Crystal Growth 2, pp. 40-44 (1968).

J. Oertel et al., "Growth of n-type polycrystalline pyrite (FeS2) films by metalorganic chemical vapour deposition and their electrical characterization", Journal of Crystal Growth 198/199, pp. 1205-1210 (1999).

D. Wan et al., "Study on pyrite FeS2 films deposited on Si(I 00) substrate by synchrotron radiation surface X-ray diffraction method", Journal of Crystal Growth 268, pp. 222-226 (2004).

PCT International Search Report and Written Opinion, PCT/US2014/043568, dated Dec. 17, 2014.

* cited by examiner

METHOD TO PRODUCE PYRITE

STATEMENT REGARDING FEDERALLY SPONSORED RESEARCH

This invention was made with government support under 0964955 awarded by the National Science Foundation. The government has certain rights in the invention.

CROSS-REFERENCE TO RELATED APPLICATIONS

This application represents the national stage entry of PCT International Application No. PCT/US2014/043568 filed Jun. 23, 2014, which claims the benefit of U.S. Provisional Patent Application No. 61/838,705 filed on Jun. 24, 2013, the disclosures of which are incorporated by reference herein by reference in their entirety for all purposes.

BACKGROUND OF THE INVENTION

1. Field of the Invention

The invention relates to methods for forming a pyrite thin film on a substrate. Specifically, the invention relates to a layer-by-layer process for making, stoichiometric, single-phase and single-crystalline or poly-crystalline semiconducting pyrite thin films on a substrate. High-quality stoichiometric, single-phase pyrite thin films can be produced on heated substrate by using sequential evaporation of Fe under high vacuum followed by sulfidation at pressures ranging from 1 mTorr to 1 Torr.

2. Description of the Related Art

Pyrite, a semiconductor having a bandgap of 0.95 eV, is made of inexpensive earth-abundant elements with an absorption coefficient larger than conventional direct bandgap semiconductors, such as GaAs. These facts have inspired photovoltaic researchers to focus attention on pyrite as a potential candidate for the development of terawatt scale photovoltaic systems. However, there has been limited progress in making sufficiently high-quality material to produce efficient devices.

Historically, there have been major obstacles to the development of terawatt photovoltaic systems as a direct result of the high cost to attain the purified reactants and to process and manufacture the materials into efficient solar cells (Lehner et al., 2012; Peshek et al., 2012; Wadia et al., 2009; Höpfner et al., 1995).

Pyrite is often listed as a material with great potential for use in terawatt scale photovoltaic applications (Lehner et al., 2012; Wadia et al., 2009; Höpfner et al., 1995; Thomas et al., 1998; Birkholz et al., 1992). To make this possibility into a reality, an inexpensive method needs to be developed that efficiently incorporates low-cost reactants and produces high-quality films.

Previous researchers have reported various techniques to synthesize pyrite thin films such as chemical vapor transport, CVT (Thomas et al., 1998), metal organic chemical vapor deposition, MOCVD (Höpfner et al., 1995; Thomas et al., 1998; Thomas et al., 1995), sputtering (Birkholz et al., 1992; Willeke et al., 1992), molecular beam epitaxy (MBE) (Bronold et al., 1997), and thermal sulfidation of iron (de las Heras et al., 1996; Meng et al., 2006) and iron oxide (Smestad et al., 1990). Films grown with MBE at low temperatures and pressures have generally produced poor structural and electrical quality (Bronold et al., 1997), presumably because the incident atoms do not have enough thermal energy to overcome the kinetic barriers for surface diffusion, nucleation, and incorporation into the pyrite lattice. At the opposite extreme, growing films with CVT, at high temperatures and pressures resulted in S-deficient (Thomas et al., 1998; Birkholz et al., 1992), non-stoichiometric thin films.

Atmospheric and low-pressure chemical vapor deposition (LPCVD) and metal-organic chemical vapor deposition (MOCVD) were applied to deposit pyrite thin films at substrate temperatures in the range 160-600° C. using Fe pentacarbonyl (IPC) as an Fe source and $H_2S$, S, tetra-butyl sulfide (TBS) or tetra-butyl disulfide (TBDS) as the S source. However, MOCVD uses expensive precursors that do not efficiently incorporated into the films.

Needed in the art is a cost-effective process for the production of high structural quality and low-contamination pyrite films.

SUMMARY OF THE INVENTION

In one aspect, the present invention provides a method for preparing a device having a film on a substrate. The film includes a single-crystalline or poly-crystalline semiconducting thin film. In one specific method, a film is deposited on a silicon substrate. The film includes at least one first element and one second element. In one specific embodiment, the first and second elements in the film are sequentially deposited on a substrate and the second element reacts with the first element in the film to form a thin film of a semiconducting compound.

In one embodiment, the substrate is a silicon wafer.

In one embodiment of the first aspect, the first element may be a metal such as iron. The second element may be any non-metal element selected from the group consisting of oxygen, sulfur, selenium, tellurium, nitrogen, phosphorus, arsenic, antimony, germanium, tin, indium, and gallium. Preferably, the second element is sulfur. More preferably, the semiconducting compound is pyrite. The film of pyrite may be stoichiometric, single-phase, either single-crystalline or polycrystalline.

In another embodiment of the first aspect, the deposition of the first element and the deposition of the second element are conducted in two separated chambers and the two chambers are switchable in a rotational manner.

In another embodiment of the first aspect, the deposition of the first element and the deposition of the second element may be conducted by using an evaporation method such as molecular beam epitaxy.

In another embodiment of the first aspect, the deposition of the first element and the deposition of the second element may be conducted under an air-tight condition. The first element may be deposited under a high vacuum such as a pressure of less than $1.5 \times 10^{-5}$ Torr. The evaporation pressure of the second element may be between 1 mTorr and 1 Torr. Preferably, a pressure difference of greater than three orders of magnitude is maintained between a first deposition zone of the first element and a second deposition zone of the second element. Preferably, the deposition processes may be conducted between 250° C. and 450° C.

In another aspect, the present invention also provides a device comprising a silicon substrate and a film on the substrate, wherein the film includes a semiconducting compound.

In one preferred embodiment of the second aspect, the substrate is silicon. In one specific embodiment, the semiconducting compound is pyrite. Preferably, pyrite is stoichiometric, single-phase, either single-crystalline or polycrystalline and the film of pyrite has a thickness larger than 25 nanometers.

In one embodiment, the film of the semiconducting compound may be identified by X-ray diffraction and Raman spectra.

It is an advantage of the invention to provide an improved method for preparing a device having a semiconducting compound of pyrite on a silicon substrate. It is an advantage of the invention to produce ~1 eV bandgap semiconductor films from inexpensive and earth-abundant precursors and at relatively low temperatures.

It is another advantage of the invention to provide methods and processes for converting films of sulfur-deficient iron sulfide compounds into films of stoichiometric, single-phase, either single-crystalline or polycrystalline pyrite.

It is still another advantage of the invention to provide an inexpensive, fast, energy efficient and environmental friendly process to grow a thin film of semiconducting pyrite.

These and other features, aspects, and advantages of the present invention will become better understood upon consideration of the following detailed description, drawings and appended claims.

DETAILED DESCRIPTION OF THE INVENTION

The term "pyrite," as used herein, refers to an iron sulfide with the formula $FeS_2$. Pyrite has a bandgap of 0.95 eV, is made of inexpensive earth-abundant elements and has an absorption coefficient larger than conventional direct bandgap semiconductors, such as GaAs. These facts have inspired photovoltaic researchers to focus attention on this material as a potential candidate for the development of terawatt scale photovoltaic systems. However, until now, there has been limited progress in making sufficiently high-quality material to produce efficient devices. Pyrite has been proposed as an abundant, inexpensive material in low cost photovoltaic solar panels. Synthetic iron sulfide may be used with copper sulfide to create the experimental photovoltaic material.

Figure 1:
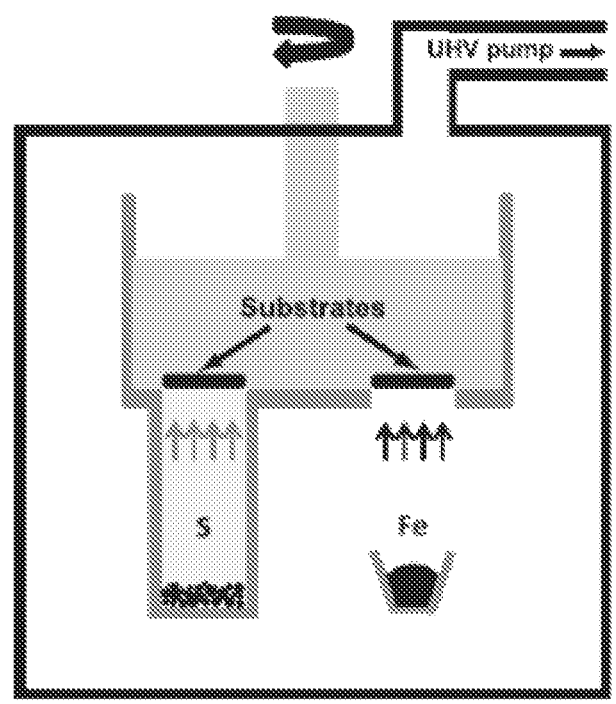
FIG. 1 is a schematic diagram showing the sequential evaporation method. The heated substrate rotates between a low-pressure Fe evaporation zone and a high-pressure S evaporation zone.

In one aspect, the present invention relates to a method or process for making a device having a film on a substrate. FIG. 1 is a schematic diagram showing one exemplary setup of the present sequential evaporation method. As shown in FIG. 1, the heated substrate rotates between a low-pressure Fe evaporation zone and a high-pressure S evaporation zone.

In a typical method or process, a substrate is initially provided. Any suitable substrates as appreciated by one skilled in the art may be used for the present invention. A suitable substrate may be either single-crystalline or polycrystalline. In one preferred embodiment, the substrate is silicon, more preferably, a silicon wafer. In another preferred embodiment, the substrate is natural pyrite.

After the substrate is provided, a film comprising at least a first element is deposited on the substrate. Any elements which are capable of forming a semiconducting compound with another element may be suitable for the first element. In one preferred embodiment, the first element is a metal element. Any metals capable of forming a semiconducting compound with another element may be suitable for the first element. More preferably, the first element is iron. Any elements capable of forming a semiconducting compound with another element may be suitable for the second element. In one preferred embodiment, the second element may be any element capable of forming a semiconducting compound with the first element. More preferably, the second element is a non-metal element. The non-metal element may be selected from the group consisting of oxygen, sulfur, selenium, tellurium, nitrogen, phosphorus, arsenic, antimony, germanium, tin, indium, and gallium. Most preferably, the second element is sulfur.

Any deposition method may be suitable for depositing the first and the second elements. A suitable deposition method may include chemical vapor transport (CVT), chemical vapor deposition (CVD), metal organic chemical vapor deposition (MOCVD), sputtering, electrodeposition, sol-gel, spray, molecular beam epitaxy (MBE) or thermal sulfidation. In one preferred embodiment, the deposition method may include any methods using evaporation techniques. More preferably, the deposition method may be MBE.

In one preferred embodiment, the depositions of the first and the second elements may be sequentially conducted. Such a sequential deposition method may also be called a layer-by-layer growth technique. For example, the first element may be deposited initially on a substrate to form a film, and the second element may be sequentially deposited on the film of the first element. Preferably, the second element may react with the film of the first element to form a film of a semiconducting compound.

In one preferred embodiment, the sequential depositions of the first and the second elements may be conducted in at least two separated chambers. More preferably, the at least two separated chambers may be positioned in such a manner, e.g., a rotational setup, that the at least two separated chambers may be repeatedly switchable. Therefore, the sequential depositions of the first and the second elements may be repeatedly conducted so that a desirable thickness for a film of a semiconducting compound may be obtained. As shown in FIG. 1, the heated substrate rotates between a low-pressure Fe evaporation zone and a high-pressure S evaporation zone.

Applicants envision that the present method or process may be used to produce a semiconducting compound having more than two elements. The more than two elements may be sequentially deposited as discussed above. In one embodiment, at least two of the elements may be simultaneously deposited.

In one embodiment, a single-crystalline substrate may be used. In one preferred embodiment, a single-crystalline semiconducting compound may be formed. More preferably, the single-crystalline semiconducting compound may be epitaxially grown on the single-crystalline substrate to form epitaxial films.

Applicants envision that depositions of the first and second elements may also be simultaneously conducted. For example, the first and the second elements may be deposited on a substrate at the same time, and during the deposition the first and the second elements may react to form a film of a semiconducting compound on a substrate.

In one embodiment, a thin film of any suitable semiconducting compounds may be produced by using the present sequential deposition method. In one preferred embodiment, a thin film of pyrite ($FeS_2$) may be produced by using the sequential deposition of iron as the first element and sulfur as the second element. More preferably, a stoichiometric, single-phase and single-crystalline pyrite ($FeS_2$) thin film may be produced. In another embodiment, the stoichiometric and single-phase pyrite ($FeS_2$) thin film may be polycrystalline. Preferably, the thin film of the semiconducting compound epitaxially grows on the substrate.

The thin film of the first element as discussed above may have any desirable thicknesses, such as 1 to 1000 nanometers, or 1 to 300 nanometers, or 1 to 100 nanometers, or 1 to 50 nanometers, or 1 to 30 nanometers, or 10 to 30 nanometers. Preferably, the thin film of the first element as discussed above may have a thicknesses of larger than 25 nanometers.

The thin film of the semiconducting compound may have any desirable thicknesses, such as 1 to 1000 nanometers, or 1 to 300 nanometers, or 1 to 100 nanometers, or 1 to 50 nanometers, or 1 to 30 nanometers, or 10 to 30 nanometers.

Preferably, the thin film of the semiconducting compound as discussed above may have a thicknesses of larger than 25 nanometers.

In one embodiment of the present invention, the deposition process of the first and second elements may be conducted under an air-tight condition. The suitable air-tight condition may include a high vacuum. For example, the deposition process of the first and the second elements may be conducted under a high vacuum.

In one embodiment, the sequential deposition process of the first and the second elements may be conducted under a relatively low temperature. In one preferred embodiment, the sequential deposition process may be conducted between 50-1000° C., 100-700° C., 200-500° C. or 250-450° C. Preferably, the sequential deposition process may be conducted between 250° C. and 450° C.

In one embodiment, the film of the semiconducting compound may be identified by one spectroscopic technique. Preferably, the spectroscopic technique is X-ray diffraction pattern.

In one embodiment, the film of the semiconducting compound may be identified by one microscopic technique. Preferably, the microscopic technique is transmission electron microscopy.

In one embodiment, a thin film of a single-phase semiconducting compound may be formed after an evaporation of the first element under a vacuum condition, and a sequential evaporation of the second element under a higher evaporation pressure of the second element. In one preferred embodiment, the evaporation pressure of the second element may be between 1 mTorr and 1 Torr.

In one embodiment, Applicants disclose methods and processes for converting a film of the second-element-deficient compound, e.g., a sulfur-deficient compound, into a film of stoichiometric, single-phase, single- or polycrystalline semiconducting compound, e.g., pyrite. A film of the second-element-deficient compound may be formed by using any suitable methods as discussed above. In one specific embodiment, the second-element-deficient compound may be formed by using the layer-by-layer growth method as discussed above. In one preferred embodiment, a film of the second-element-deficient compound may be converted into a film of stoichiometric, single-phase, single- or polycrystalline semiconducting compound under a sufficient pressure of the second element. More preferably, the second-element-deficient compound may be sulfur and the semiconducting compound may be pyrite. The suitable pressure of sulfur may be between 1 mTorr and 1 Torr.

In one embodiment, the thin film of the semiconducting compound may be identified by X-ray diffraction pattern and Raman spectroscopy. In another embodiment, the single- or polycrystallinity of the film of the semiconducting compound may be identified by transmission electron microscopy.

In another embodiment, the epitaxial behavior of the semiconducting compound film may be characterized by a Rutherford Backscattering Spectrometry (RBS) channeling measurement.

In another aspect, the present invention relates to a device having a semiconducting thin film. The device may be made following any of the methods or processes as discussed above. In one embodiment, the device may comprise a substrate and a film on the substrate. In one preferred embodiment, the film may comprise iron sulfide. In one embodiment of the present invention, the iron sulfide in the film may be stoichiometric, single-phase and single-crystalline. In another embodiment of the present invention, the iron sulfide in the film may be stoichiometric, single-phase and polycrystalline. More preferably, the iron sulfide is pyrite.

The film of the device may have various thicknesses such as 1 to 1000 nanometers, or 1 to 300 nanometers, or 1 to 100 nanometers, or 1 to 50 nanometers, or 1 to 30 nanometers, or 10 to 30 nanometers. In one embodiment, the film of the device may have a thicknesses larger than 25 nanometers. The film of the device may be either single-crystalline or polycrystalline. In one preferred embodiment, the film of the device may be a semiconducting compound of pyrite ($FeS_2$). More preferably, the film of the device may be a semiconducting compound of stoichiometric, single-phase and single-crystalline pyrite ($FeS_2$).

Figures 6A, 6B, 6C:
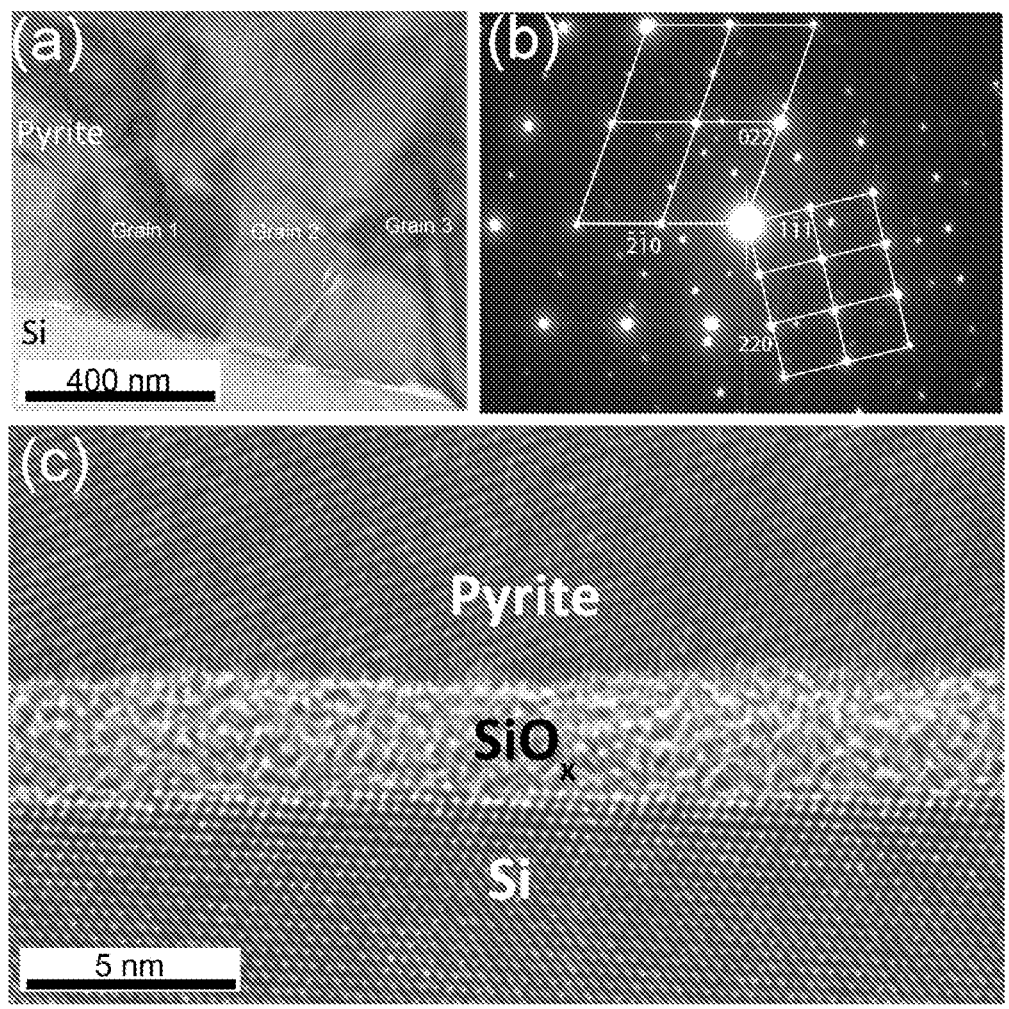
FIG. 6 is a set of pictures showing; a) a TEM image, b) a diffraction pattern, and c) HRTEM image of a pyrite thin film grown on a silicon substrate at 350° C. and $P_s$=1 mTorr. The SiOx layer formed by oxidation of the Si substrate before pyrite growth. (d) STEM annular dark-field image of defect-free pyrite grain from (a); the bright spots are the Fe columns. (e) STEM annular bright-field image of the same grain showing the positions of the atoms. The inset is a crystallographic model of the projection of the pyrite structure, with the Fe atoms represented by black dots and the S atoms represented by the grey spheres. This image shows that the black spots and the dark grey features in the experimental image correspond to Fe and S atoms, respectively. The black rectangle outlines a unit cell.

In one embodiment, a polycrystalline layer of thin film may form on the substrate. FIGS. 6a-6c and the Example show a polycrystalline pyrite film on a silicon substrate and an amorphous $SiO_x$ layer having a thickness of 3 nm present between the pyrite film and the silicon substrate. Applicants envision that a better cleaning process for the substrate may be needed to optimize quality of the films on silicon substrate.

In one embodiment, the quality of homo-epitaxial grown films may be characterized by a techniques such as Rutherford Backscattering Spectrometry (RBS) for channeling measurement. The RBS channeling measurement may be performed before and after deposition. In the Example, e.g., FIGS. 8a-8b, the observations demonstrate that the films on natural pyrite with the textured (epitaxial) behavior are not grown randomly. The $\chi_{min}$ of 11-50% was calculated from RBS channeling of the homo-epitaxial films.

Figure 9:
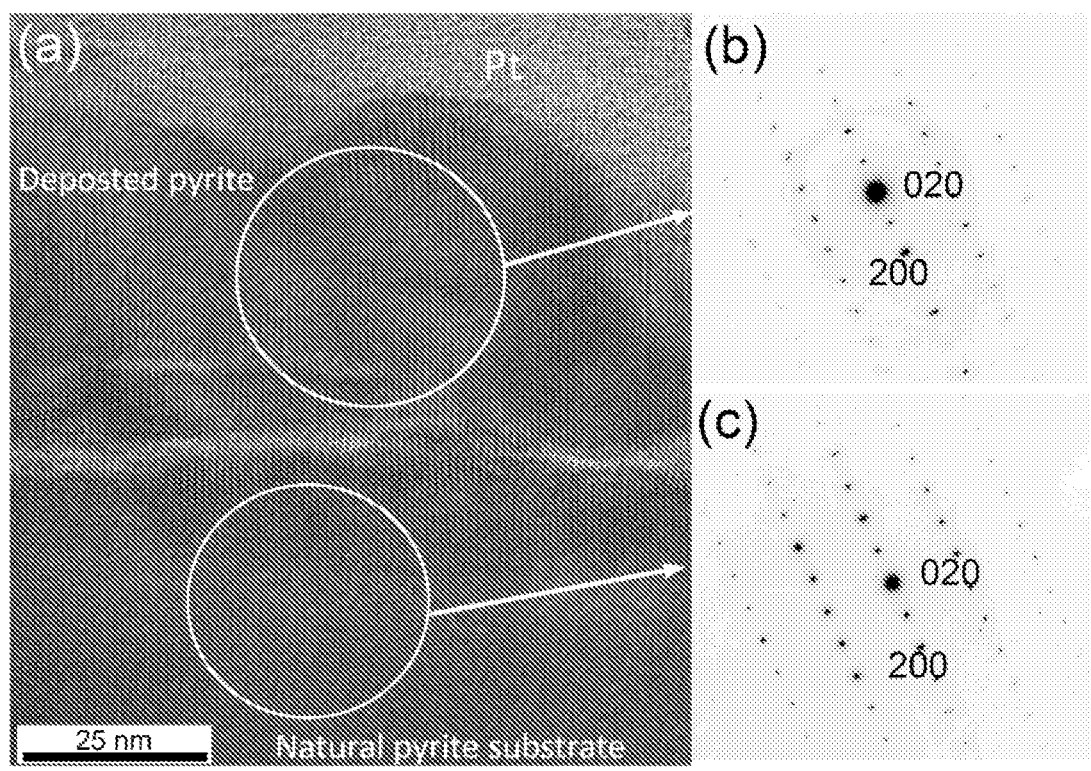
FIG. 9 is a set of pictures showing a TEM image of an epitaxial pyrite thin film grown on a natural pyrite substrate at $T_g$=350° C. and $P_S$=1 mTorr along with diffraction patterns of the selected areas.
Figure 10:
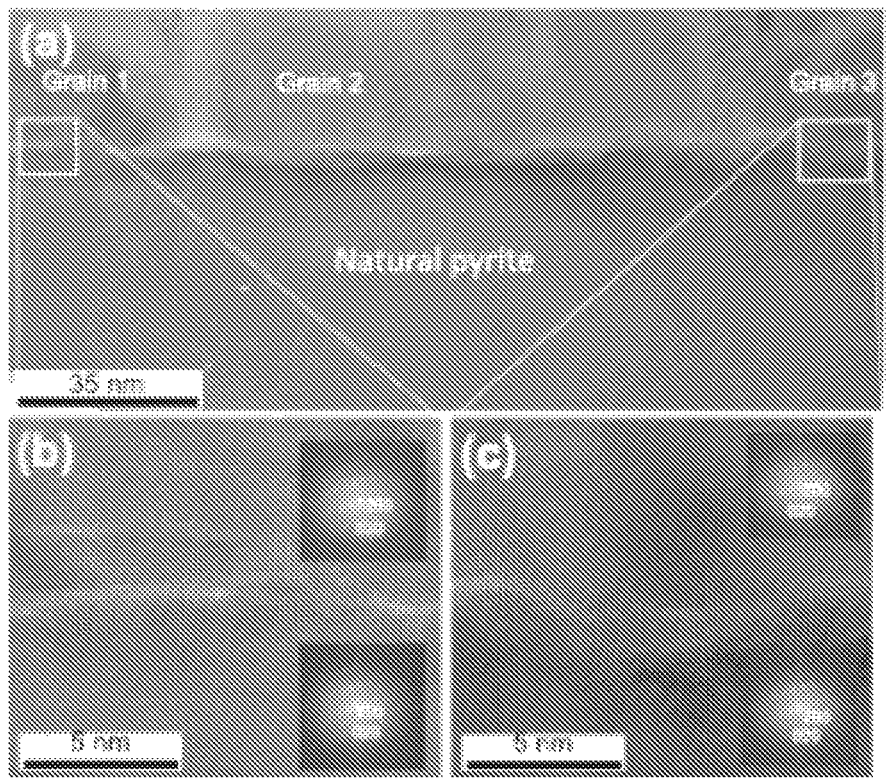
FIG. 10 is a set of pictures showing (a) HRTEM images of individual homo-epitaxial grains from a pyrite thin film grown at 350° C. and an S pressure of 1 mTorr, (b and c) close up images of the grains indicating epitaxial growth. Insets are fast Fourier transforms of the grains (top) and substrate (bottom).

In one embodiment, an epitaxial layer may be formed on the natural pyrite substrate. FIGS. 9-10 and the Example show an epitaxial pyrite film on a natural pyrite substrate.

Figure 11:
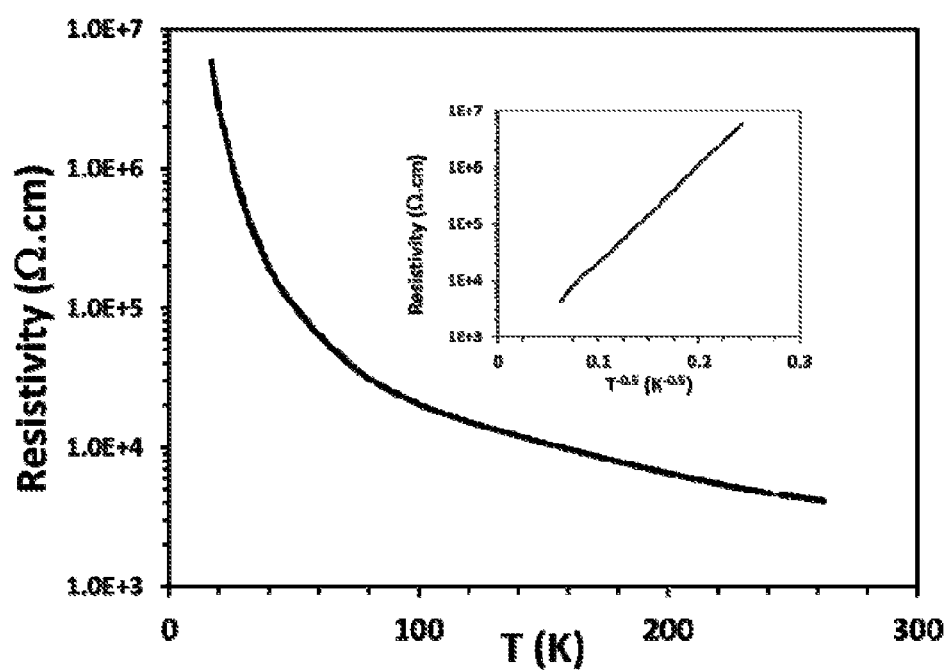
FIG. 11 is a diagram showing a correlation of resistivity vs. temperature for a sample grown on $SiO_x$/Si at 350° C. and $P_S$=1 mTorr; inset: data fitted to the hopping model.

In another embodiment, electrical measurement on the film of the device may be conducted. In one preferred embodiment, Electrical measurement on the film of the device may be conducted using an I-V set with a two-point probe configuration. In the Example, e.g., FIG. 11, the observations demonstrate suitable photo responses and resistances. For example, ~5% photo response was detected in the film grown on $SiO_x$/Si at 300° C. and $P_S$ (sulfur evaporation pressure) of 1 mTorr. A correlation of resistivity vs. temperature as shown in FIG. 11 showed a good agreement to a linear fit with $T^{-0.5}$ suggesting variable range hopping as a dominant mechanism of conductance (Massey and Lee, 1995; Efros and Shklovskii, 1995).

In one embodiment, the thin film of the semiconducting compound produced in the present invention shows high electrical properties. The films are crystalline and exhibit a significant photoconductivity response. For example, Current-voltage (I-V) electrical measurements in a 2-point configuration were performed on a pyrite film grown on SiOx/Si at 300° C. and a S pressure of 1 mTorr. A photo response of ~5% was detected in the film. The resistivity was measured from 20-300 K using the Van der Pauw configuration with In ohmic contacts (FIG. 11). The data follow a linear fit of resistivity versus $T^{-0.5}$, indicating that the dominant transport mechanism is variable-range hopping (Massey and Lee, 1995; Efros and Shklovskii, 1975).

In one embodiment, the present invention developed methods to produce high-quality pyrite thin-films with n- and p-type doping that are potentially useful for PV applications. The present methods or processes also provide a fundamental understanding of the thermodynamic and kinetic factors involved in producing high-quality epitaxial pyrite thin-films. The present invention also provides information regarding how growth conditions influence the structural, chemical, electrical, and optical properties of the films.

Applicants envision that the present invention may be used to develop pyrite solar cells with comparable efficiency to current commercial solar cells. The results could lead to the development of TW-scale energy generation systems that are clean, renewable, and cost competitive with our current hydroelectric, coal, and nuclear sources.

Using high structural quality n- and p-type pyrite films produced with controlled levels of contamination, Applicants can develop thin, efficient p-n junction and/or heterojunction solar cells. The concentration of native and impurity deep-level defects with large carrier capture cross-sections will be controlled to attain sufficiently long minority carrier lifetimes and diffusion lengths in order to maximize the collection volume and to allow efficient transport across the collection region without experiencing significant performance-killing recombination.

The present invention provides many advantages over other methods. For example, the present invention allows production of epitaxial pyrite layers using homo-epitaxial growth on natural pyrite substrates. The present invention allows identification of impurities that can dope pyrite to achieve conducting n-type and p-type material. The present invention allows deposition of a low-temperature-growth seed layer to improve the morphology and obtain large, flat crystals. The present invention can also allow fabrication of pyrite thin films with clear evidence of band conduction. Further, the present invention allows measurement of the bandgap and joint density of states in grains in our thin films as small as 100 nm diameter using ultra-high resolution electron energy-loss spectroscopy. The present invention also allows characterization of the electrical properties of a suite of metal/pyrite contacts to establish low-resistance Ohmic contacts (e.g. Ni, Co) needed in PV devices and Schottky barrier structures (e.g. Fe, Cr, Al).

Applicants envision that by using the present invention one can optimize the thin-film growth conditions to produce controlled n- and p-type doping, high carrier mobilities, and long carrier diffusion lengths. The present methods or processes will also allow one skilled in the art to fabricate and then optimize the performance of pyrite-based PV devices. Applicants anticipate that the work will result in efficient pyrite p-n junction and heterostructure solar cells.

Applicants envision that Schottky-barrier devices may be produced by using the present methods or processes. Further, Applicants envision that heterostructure devices using a single p-type pyrite absorbing layer together with an n-type CdS window layer may be produced. These heterostructure devices are similar to those used in CdTe and $CuInGaSe_2$ (CIGS) technology.

The present methods or processes may also be used to synthesize and characterize the properties of p-n and p-i-n homojunctions to determine the optimal choice of device configurations for this class of materials.

Further, the present methods or processes of sequential-evaporation synthesis may also be used to produce other II-VI materials. A suite of promising earth-abundant materials, including (ZnFe)S (Ea 3.5 eV), MgS (Ea 2.7 eV), MnS (Ea 2.7 eV), and CaS (Ea 2.1 eV), have cubic structure with cell dimensions close to pyrite. They all occur in solid solution with FeS (troilite), and by varying FeS content it is possible to use bandgap engineering for lattice-matched or near-lattice-matched heterostructure growth.

EXAMPLES

The following Examples are provided in order to demonstrate and further illustrate certain embodiments and aspects of the present invention and are not to be construed as limiting the scope of the invention.

Example 1

Experiments

In this method, the thin films were grown in a baked ultra-high-vacuum (UHV) chamber with an unbaked base pressure below $2 \times 10^{-7}$ Torr. The majority of the background pressure is from sulfur. An alumina coated tungsten crucible was used to thermally evaporate iron (99.98% pure, Alfa Aesar) and an alumina crucible was used to thermally evaporate sulfur (99.999% pure, Alfa Aesar). Particle Induced X-ray Emission (PIXE) measurements demonstrated no evidence of impurities in the Fe reactant material down to the detectable limit of 10 ppm.

For the sequential evaporation method, the heated substrate rotates between a low-pressure Fe evaporation zone and a high-pressure S evaporation zone (FIG. 1), similar to the pocket heater developed by Kinder (Kinder, Berberich, et al., 1997) and used by others (Moeckly and Ruby, 2006). Fe evaporation is performed using an alumina-coated W crucible in the unbaked UHV chamber with a base pressure $<1.5 \times 10^{-5}$ Torr, where most of the background pressure is S vapor. The S pressure inside the S evaporation zone is maintained between 1 mTorr and 1 Torr. A pressure difference of greater than three orders of magnitude between the Fe and S deposition zones can be achieved. The rotation speed was fixed at ~4.5 rpm.

The stoichiometry and thicknesses of the thin films was inferred from Rutherford backscattering spectroscopy (RBS) measurements. Energy-dispersive X-ray analysis, secondary-ion mass spectroscopy and PIXE were used to validate the conclusions from the RBS analysis and monitor the trace contaminants. Structural characterization and phase identification were performed using high-resolution X-ray diffraction (PANalytical X'Pert PRO®). Raman spectroscopy was used to confirm the presence of the pyrite and secondary phases identified by XRD.

The Raman laser was operated with less than 5 mW of 532 nm laser excitation to prevent decomposition at the surface from heating effects. Scanning electron microscopy and transmission electron microscopy (TEM) were used to study the structural and chemical properties of the thin films. An aberration-corrected 200 kV JEOL ARM scanning TEM (STEM) was used for atomic-scale imaging and chemical analysis.

Other microscopes used for TEM imaging included JEOL 4000 EX 400 kV and JEOL 2000 200 kV instruments. High-angle annular dark-field (HAADF) imaging and annular bright-field (ABF) imaging was used to detect both the Fe and S atomic columns. The HAADF technique provides contrast that is approximately proportional to the square of atomic number but is insensitive to light elements such as S. The ABF technique uses a beam stop to subtract the small collection-angle bright-field signal from the large collection-angle bright-field signal with the effect of rendering dark contrast to lighter elements (Findlay and Shibata, 2010; Okunishi, Sawasa, et al., 2012). Electrical measurements were performed on the thin films, including photoconductivity using a two-point probe, and resistivity using a four-point probe in the van der Pauw configuration.

To grow films using the sequential evaporation method, iron deposition is performed in the high-vacuum zone and then sample rotates to a high-pressure sulfur deposition zone achieving sequential deposition. The sample holder and heater is similar to that developed by Kinder et al. (Kinder, Berberich, et al., 1997) and used by others (Moeckly and Ruby, 2006). In this design, iron deposition is performed in the high vacuum zone and then sample rotates on the order of a second to the high pressure sulfur environment. A pressure difference of better than three orders of magnitude between the iron deposition and sulfur deposition zones is maintained in our system.

Results and Discussion

Figure 2:
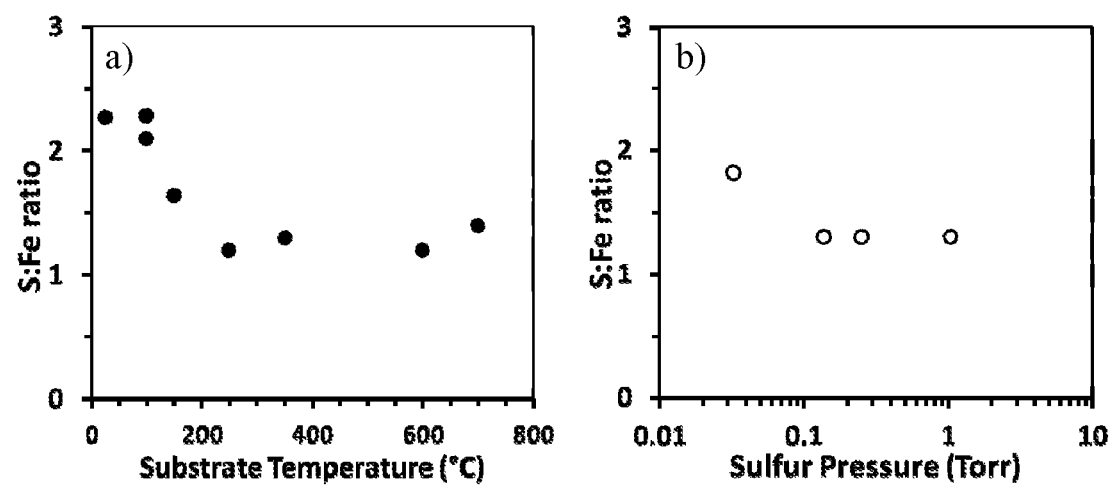
FIG. 2 is a set of diagrams showing pyrite thin films grown at a) different substrate temperatures in 1 Torr sulfur pressure, b) at different sulfur pressures with a substrate temperature of 350° C. All films were cooled down in-situ in vacuum after growth.

Films deposited with traditional MBE growth at 1 Torr of sulfur pressure with substrate temperatures over 100° C. and then cooled down in vacuum are sulfur deficient, as shown in FIG. 2a. These results are in agreement with Bronold et al. (Bronold et al., 1997). Similarly, growth over a range of sulfur pressures with substrate temperatures of 350° C. (FIG. 2b) produced films that are also sulfur deficient. It is important to note that these conditions fall in the stable region of the phase diagram (Waldner and Pelton, 2005). In fact, at a sulfur pressure of 1 Torr, pyrite is the stable phase up to temperatures of ~550° C.

Figure 3:
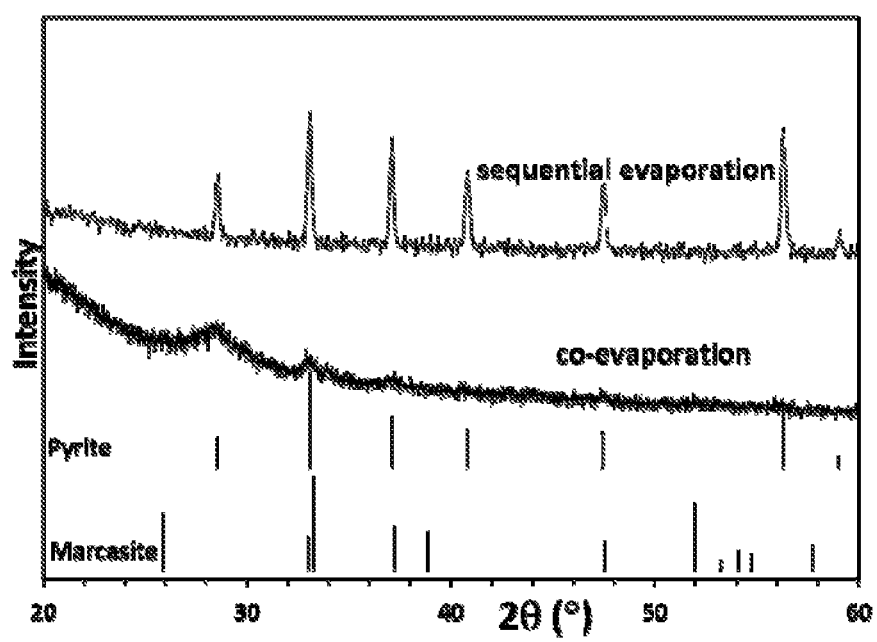
FIG. 3 is a diagram showing a comparison of XRD results for (upper) films grown by sequential evaporation at a substrate temperature of 350° C. and sulfur pressure of 1 Torr, and (lower) MBE films grown and cooled down in a sulfur pressure of 1 Torr at a substrate temperature of 350° C.
Figure 4:
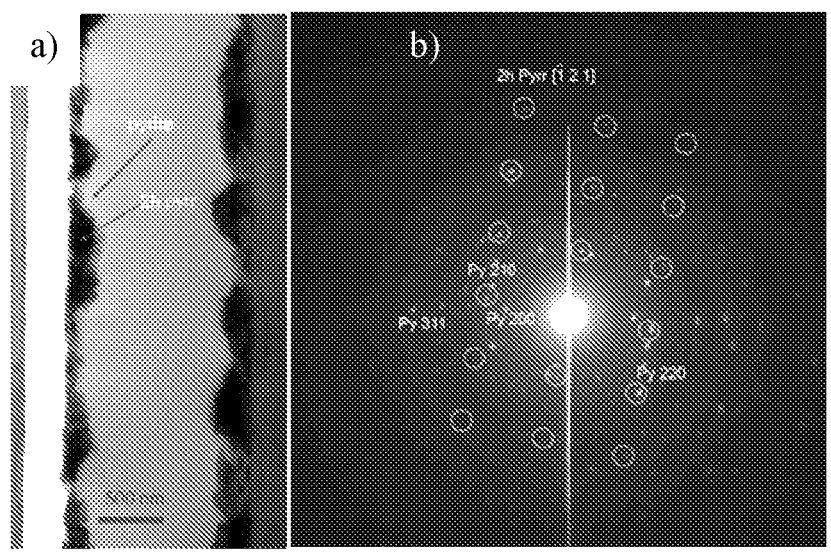
FIG. 4 is a set of pictures of a) a TEM image of a pyrite thin film grown at $T_{substrate}$=350° C., $P_S$=1 Torr, and cooled down in sulfur, showing a layer of pyrite on top of thick layer of pyrrhotite, b) a TEM diffraction pattern of the same film, showing pyrrhotite diffraction spots and pyrite rings.

We were unable to produce single-phase pyrite with traditional MBE, even when S pressures of 1 Torr were used. We did, however, produce stoichiometric pyrite during cool-down from the growth temperatures in a S-rich environment. When films were grown using this MBE technique at a substrate temperature of 350° C. and then cooled in a sulfur pressure of 1 Torr, the S:Fe ratio increased from ~1.3:1 to ~1.9:1 and formation of pyrite was detected by XRD (FIG. 3) and TEM (FIG. 4). The XRD results from this film are comparable with those observed for pyrite film grown by MBE at 120° C., as reported by Bronold et al. (Bronold et al., 1997).

TEM analysis of the MBS-grown film showed two distinct regions. That nearest the substrate comprises a 125 nm layer of pyrrhotite ($Fe_{1-x}$ S), which is covered by a 25 nm layer of pyrite that presumably formed during post-growth cooling (FIGS. 4a and b). This observation shows that the growth of pyrite thin films requires either lower temperatures, higher S pressures, or both, presumably resulting from a kinetic barrier to the conversion of either Fe or pyrrhotite to pyrite.

These results suggest that the top 25 nm thick layer of the sulfur deficient films was converted to pyrite during cool down. The structure was very poor quality and we were not able to use the MBE method to produce device-quality pyrite, even when growing at sulfur pressures as high as 1 Torr.

The work suggests that the stoichiometry of the iron-sulfur films depends strongly on the sulfur incorporation rate and thus the kinetically-limited sticking coefficient. The nature of iron-sulfur bonding in pyrite is unusual and is almost certainly the reason that the sulfur sticking coefficient depends so strongly on the $Fe_{1-x}S$ stoichiometry. First, the sticking coefficient of sulfur bonding to iron or mostly iron is energetically favorable, to form troilite (FeS) and even pyrrhotite ($Fe_{1-x}S$) with x<0.5. Second, the sticking coefficient of sulfur to approach the stoichiometry $FeS_2$ involves the creation of a bond between the impinging species and the sulfur already strongly bonded to iron. The driving force for this is apparently not as strong and occurs at reduced temperatures (<100° C.) and higher sulfur pressures ($P_S$~1 Torr). Note that the driving force scales with Kt ln $P_s$, where k is the Boltzman constant, T is temperature in Kelvin, and $P_s$ is the pressure of sulfur.

To overcome this kinetic step of forming $FeS_2$, we devised a layer-by-layer growth method that comprises sequential evaporation of Fe in vacuum followed by exposure to a high-pressure (i.e., up to 1 Torr) S environment. The reduced pressure of S during the deposition of Fe and absence of Fe during incorporation of S enhances adatom surface mobility during each step, which increases the driving force for each reaction. This sequential evaporation method enabled growth of single-phase pyrite with vastly improved quality relative to that with the traditional MBE method (FIG. 3).

Figure 5:
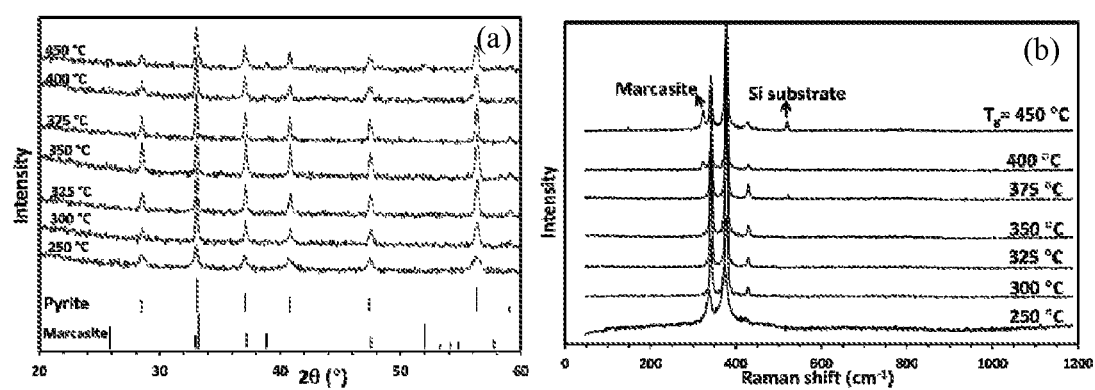
FIG. 5 is a set of diagrams showing; a) XRD, b) Raman results of sequentially deposited pyrite films at different substrate temperatures at $P_s$=1 mTorr grown on Si (100).

The film quality, as judged by the narrowest XRD peaks at full-width half-maximum, increased with substrate temperature and was optimized at 350° C. for a S pressure of 1 mTorr (FIG. 5). Marcasite was detected during both XRD and Raman spectroscopy in films grown above 375° C. Films deposited on thermally oxidized silicon ($SiO_x/Si$), $Al_2O_3$ and MgO substrates have similar structural and chemical properties, as judged by XRD, Raman and RBS analysis.

We used an evaporation method that facilitates the sequential evaporation of sulfur in high pressure and iron in vacuum. The elimination of iron during exposure and incorporation of sulfur and the reduced pressure of sulfur during deposition and incorporation of iron allows enhanced adatom surface mobility during each process and a stronger driving force for reaction, particularly in the case of sulfur. The use of this process enabled the growth of stoichiometric and single phase pyrite, as we describe below. FIG. 3 shows the XRD results of a film grown by this sequential method at 350° C. by applying only $P_s$=1 mTorr to the S annealing zone compared to the best film grown using the MBE method. RBS results indicated 2400 Å thickness and a near-ideal stoichiometry of $FeS_{2.04}$.

Figure 7:
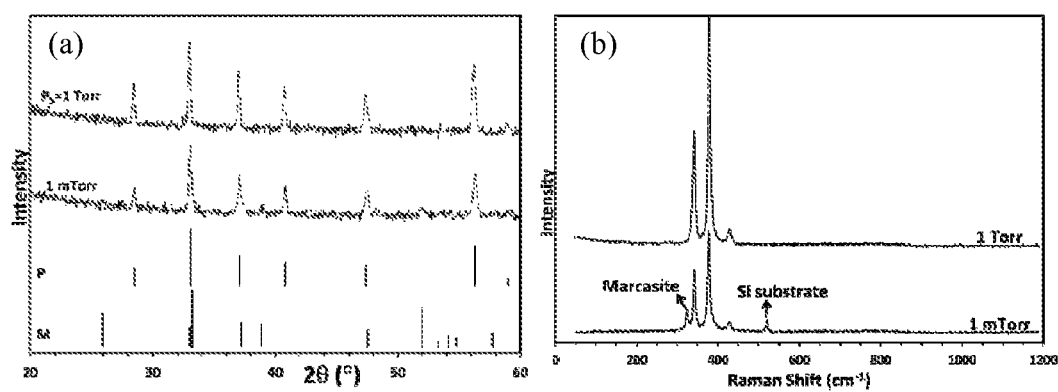
FIG. 7 is a set of graphs showing; a) XRD, and b) Raman results of sequentially deposited pyrite films at 450° C. substrate temperatures at $P_s$=1 mTorr and 1 Torr.

The effect of substrate temperature on the composition and structure of the thin films prepared by sequential deposition of iron and sulfur at $P_s$=1 mTorr was studied. FIG. 5-a and b show the XRD and Raman results, respectively, of films grown on Si (100). The film quality increased with increasing substrate temperature. The deposited films on silicon, $Al_2O_3$ and MgO substrates are single-phase polycrystalline pyrite for all temperatures, ranging from 250 up to 450° C. The highest structural quality films, as judged by the narrowest full width half maximum XRD peaks, were grown at 350° C. for sulfur pressures of 1 mTorr. For growth at higher temperatures at the same pressure, marcasite was detected by both XRD and Raman spectroscopy. The XRD and Raman spectra of films grown at 450° C. under different sulfur pressures is shown in FIGS. 7-a and b. By increasing the $P_S$ to 1 Torr the growth temperature yielding single-phase pyrite films was increased to 450° C. comparable to the work of Thomas et al. (Thomas et al., 1995), who reported growing stoichiometric pyrite in a narrow range of 450-500° C. by MOCVD followed by cooling down in a sulfur-rich environment. These results are consistent with the phase diagram in Waldner et al. (Waldner and Pelton, 2005), which indicates that pyrite is stable up to 550° C. at sulfur pressure of 1 Torr.

Increasing the S pressure to 1 Torr resulted in the formation of single-phase pyrite films at substrate temperatures up to 450° C. (FIG. 7). The use of high S pressures during growth and cool-down in the MOCVD study of Thomas et al. (Thomas, Höpfner, et al., 1995) also produced stoichiometric pyrite at 450-500° C. Both these results are consistent with the Fe—S phase diagram (Waldner and Pelton 2005; Baker and Parks, 1986; Toulmin and Barton, 1964), which indicates that pyrite is stable up to 550° C. at S pressure of 1 Torr.

The TEM image of the pyrite film grown on silicon, FIG. 6, shows the presence of pyrite grains grown randomly on the silicon substrate. The diffraction pattern confirms this result. FIG. 6, also, confirms the presence of a 3 nm amorphous $SiO_x$ layer. Better cleaning of the substrate is needed to optimize the films on silicon. Pyrite films grown on Si(100) substrates at 350° C. and S pressures of 1 mTorr comprise randomly oriented grains 300-400 nm in diameter (FIGS. 6a and b). High-resolution TEM images indicate that high-quality, defect-free grains are separated from the substrate by a 3 nm amorphous $SiO_x$ layer (FIG. 6c), which presumably prevented the epitaxial growth of pyrite on the Si substrate. Improved substrate cleaning methods are needed to achieve epitaxy on Si substrates.

Figures 6D, 6E:
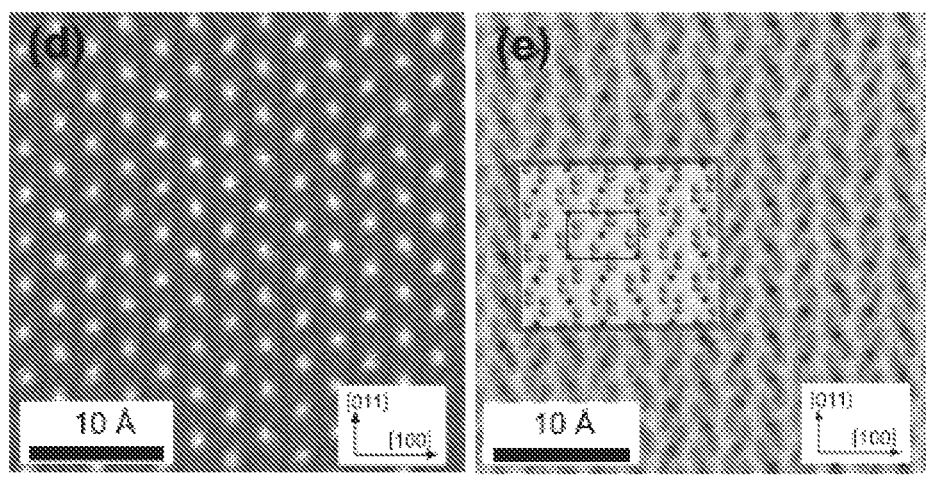

The pyrite structure can be compared to that of NaCl, with Fe at the Na site and the S dimers at the Cl position, with their long axes oriented along the (111) directions. The HAADF image oriented along the (0$\bar{1}$1) direction clearly shows defect-free columns of Fe atoms (FIG. 6d). The columns of S atoms can be seen in the ABF image along the same orientation, with no indication of S vacancies (See FIG. 6e).

Non-epitaxial polycrystalline pyrite films have been grown using a number of methods on a wide range of substrates, including those with small lattice mismatch to pyrite (e.g., ZnS, Si and GaP) (De las Heras, and Sanchez, 1991; De las Heras C, Ferrer, et al., 1991; De las Heras, et al., 1996; Meng, et al., 2002; Bausch, et al., 1990; Ferrer, et al., 1994; Smestad, et al., 1990; Willeke, et al., 1992; Bronold, et al., 1997; Berry, et al., 2012; Schleich, et al., 1991; Thomas, et al., 1995; Smestad, Dasilva, et al., 1989; Meester, Reijnen, et al., 2000). To produce epitaxial structures, we investigated the use of our sequential evaporation method and deposition on natural pyrite substrates. For this homo-epitaxy study, we started with two 1 $cm^2$ (100) oriented faces from natural pyrite cubes. Growth was performed at a 350° C. substrate temperature and a S pressure of 1 mTorr. Si substrates were included as a control.

Pyrite films grown by different methods on wide range of substrates, such as ZnS, silicon and GaP with very small lattice mismatch to pyrite, have always showed polycrystalline structure and no epitaxial growth has been reported so far (Thomas et al., 1995; Willeke et al., 1992; Bronold et al., 1997). We used the (100) orientation of natural pyrite for substrates and deposited homo-epitaxial pyrite under the best conditions (i.e., 350° C. and $P_S$=1 mTorr). To characterize the quality of the homo-epitaxial film, RBS channeling measurements were performed before and after deposition, FIG. 8. Simulation of randomly oriented pyrite is also plotted. It is clear that the film on the natural pyrite substrate it is not grown randomly and shows the textured (epitaxial) behavior. The $\chi_{min}$ of 11-50% was calculated form RBS channeling of the homo-epitaxial film.

Figure 8A:
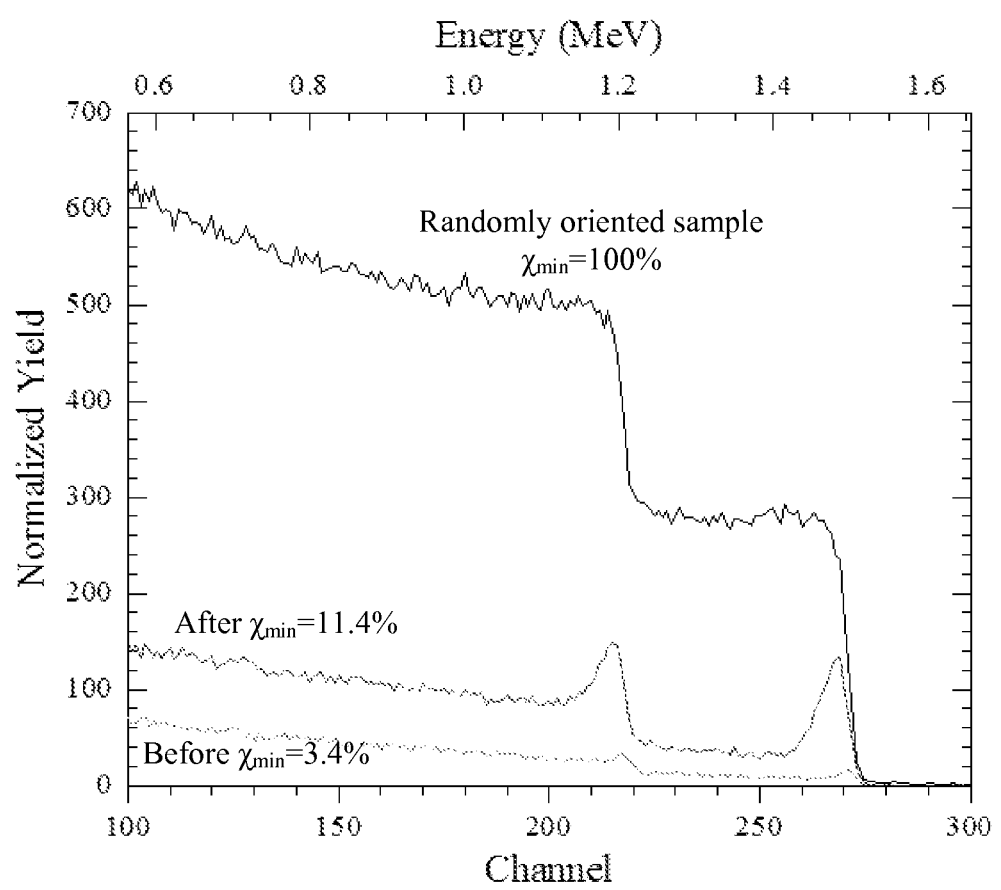
FIG. 8 is a graph showing RBS channeling results of homo-epitaxial grown film on (a) a natural pyrite showing homo-epitaxy and (b) a Si substrate.
Figure 8B:
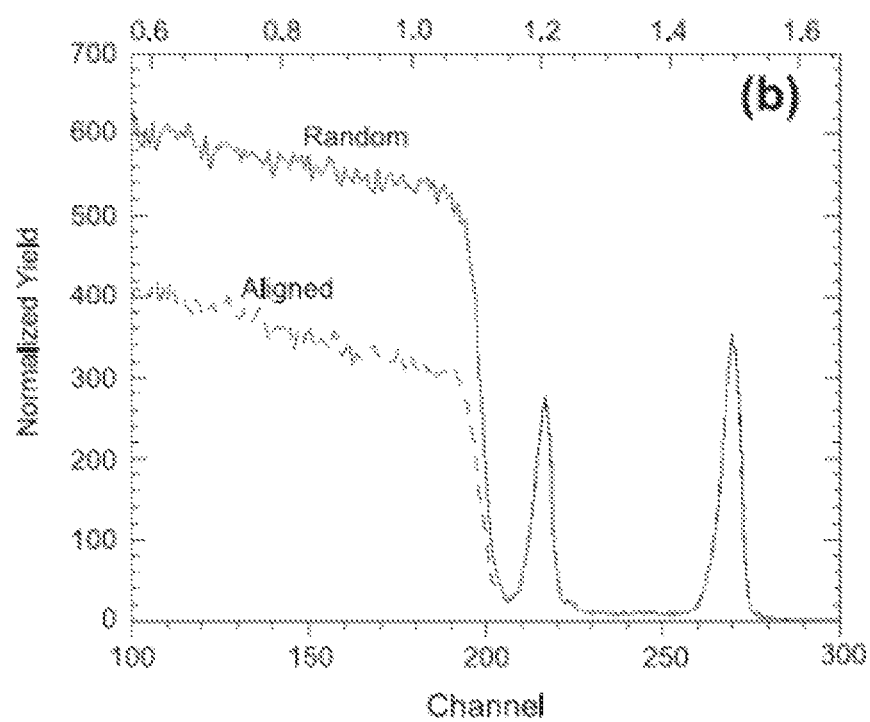

Channeling RBS measurements were used to characterize the epitaxial quality of thin films. Channeling $RBS_{\chi min}$ of 3% was determined for the natural pyrite substrate and a $\chi$min of 11% for the deposited thin-film on natural pyrite (FIG. 8a). When compared to the ~58% $\chi$min for the film grown on Si (FIG. 8b), it is clear that the film grown on natural pyrite exhibits textured (epitaxial) characteristics.

As shown in FIG. 9, High Resolution TEM imaging and electron diffraction of the film grown on the natural pyrite substrate showed an epitaxial growth. High-resolution TEM images of pyrite films grown on natural pyrite substrates indicate (FIGS. 9 and 10) that the films comprise individual epitaxially-grown grains that are 100-150 nm diameter. The presence of individual epitaxial grains indicates heterogeneous nucleation on natural pyrite. In addition, many of the grains have stacking faults.

Electrical measurements on the pyrite film were performed using I-V set up with a 2 point probe configuration. Resistivity of the sample at various temperatures was measured using van der Pauw configuration. Results, FIG. 11, show a good agreement to a linear fit with $T^{-0.5}$ suggesting variable range hopping as a dominant mechanism of conductance (Massey and Lee, 1995; Efros and Shklovskii, 1975). A ~5% photo response was detected in the film grown on $SiO_x/Si$ at 300° C. and $P_S$ of 1 mTorr.

Current-voltage (I-V) electrical measurements in a 2-point configuration were performed on a pyrite film grown on SiOx/Si at 300° C. and a S pressure of 1 mTorr. A photo response of ~5% was detected in the film. The resistivity was measured from 20-300 K using the Van der Pauw configuration with In ohmic contacts (FIG. 11). The data follow a liner fit of resistivity versus $T^{-0.5}$, indicating that the dominant transport mechanism is variable-range hopping (Massey and Lee, 1995; Efros and Shklovskii, 1975).

The pyrite bandgap of ~0.95 eV is appealing, given that a single-junction solar cell with this bandgap would have a maximum efficiency, as defined by the Shockley-Queisser Limit (SQL), of 29.5%. The use of pyrite is also amenable to the development of multi-junction solar cells. Its absorption coefficient at energies above the bandgap is two orders of magnitude higher than Si. Pyrite films as thin as 100 nm can absorb 90% of available light [6]. Although pyrite has an indirect 0.95 eV bandgap, the splitting between the valence-band maximum (VBM), located between X and Γ, and the valence band at Γ, which is below the conduction-band minimum (CBM), is only 0.03 eV. This configuration offers the advantages of both direct and indirect gap semiconductors. Although absorption is strong, a large portion of holes are concentrated at the VBM, well removed from Γ, reducing the recombination rate.

In the present invention, the use of the sequential-evaporation method resulted in the first reliable and reproducible synthesis of high quality, single-phase stoichiometric $FeS_2$ thin films from elemental reactants.

CONCLUSIONS

We have shown that stoichiometric and single-phase pyrite ($FeS_2$) thin films can be synthesized by a layer-by-layer growth technique using sequential evaporation of iron in high vacuum and sulfidation in pressures from 1 mTorr to 1 Torr at temperatures ranging from 250-450 C. Additionally, pyrite can be grown epitaxially on natural pyrite substrates.

High-quality pyrite ($FeS_2$) thin films can be synthesized using a layer-by-layer growth technique with sequential evaporation of Fe in high vacuum followed by sulfidation at S pressures between 1 mTorr and 1 Torr at temperatures between 250 and 450° C. The films are crystalline and exhibit a significant photoconductivity response. Electrical measurements indicate that the dominant transport in the films is by variable-range hopping. Additionally, pyrite can be grown epitaxially on natural pyrite substrates.

Although the invention has been described in considerable detail with reference to certain embodiments, one skilled in the art will appreciate that the present invention can be practiced by other than the described embodiments, which have been presented for purposes of illustration and not of limitation. Therefore, the scope of the appended claims should not be limited to the description of the embodiments contained herein.

REFERENCES

1. S. W. Lehner, N. Newman, M. van Schilfgaarde, S. Bandyopadhyay, K. Savage, P. R. Buseck, "Defect energy levels and electronic behavior of Ni-, Co-, and As-doped synthetic pyrite ($FeS_2$)", J. Appl. Phys., 111 (2012) 083717.
2. T. J. Peshek, L. Zhang, R. K. Singh, Z. Tang, M. Vahidi, B. To, T. J. Coutts, T. A. Gessert, N. Newman, M. van Schilfgaarde, "Criteria for improving the properties of $ZnGeAs_2$ solar cells", Prog. Photovolt: Res. Appl., (2012).
3. C. Wadia, A. P. Alivisatos, D. M. Kammen, "Materials Availability Expands the Opportunity for Large-Scale Photovoltaics Deployment", Environ. Sci. Technol., 43, (2009) 2072.
4. C. HÖpfner, K. Ellmer, A. Ennaoui, C. Pettenkofer, S. Fiechter, H. Tributsch, "Stoichiometry-, phase- and orientation-controlled growth of polycrystalline pyrite ($FeS_2$) thin films by MOCVD", J. Cryst. Growth, 151 (1995) 325.
5. B. Thomas, T. Cibik, C. HÖpfner, K. Diesner, G. Ehlers, S. Fiechter, K. Ellmer, "Formation of secondary iron-sulfur phase during the growth of polycrystalline iron pyrite ($FeS_2$) thin films by MOVCD", J. Mater. Sci. Mater. El., 9 (1998) 61.
6. M. Birkholz, D. Lichtenberger, C. HÖpfner, S. Fiechter, "Sputtering of thin pyrite films", Sol. Energ. Mat. Sol. C., 27 (1992) 243.
7. B. Thomas, C. HÖpfner, K. Ellmer, S. Fiechter, H. Tributsch, "Growth of FeS 2 (pyrite) thin films on single crystalline substrates by low pressure metalorganic chemical vapour deposition", J. Cryst. Growth, 146 (1995) 630.
8. G. Willeke, R. Dasbach, B. Sailer, E. Bucher, "Thin pyrite ($FeS_2$) films prepared by magnetron sputtering", Thin Solid Films, 213 (1992) 271.
9. M. Bronold, S. Kubala, C. Pettenkofer, W. Jaegermann, "Thin pyrite ($FeS_2$) films by molecular beam deposition", Thin Solid Films, 304 (1997) 178.
10. C. de las Heras, J. L. Martin de Vidales, I. J. Ferrer, C. Sanchez, "Structural and microstructural features of pyrite $FeS_{2-x}$ thin films obtained by thermal sulfuration of iron", J. Mater. Res., Vol. 11, 1 (1996) 211.
11. L. Meng, Y. H. Liu, W. Huang, "Synthesis of pyrite thin films obtained by thermal-sulfurating iron films at different sulfur atmosphere pressure", Mat. Sci. Eng. B, 90 (2002) 84.
12. G. Smestad, A. Ennaoui, S. Fichter, H. Tributsch, W. K. Hofmann, M. Birkholz, "Photoactive thin film semiconducting iron pyrite prepared by sulfurization of iron oxides", Sol. Energy Mater., 20 (1990) 149.
13. P. Waldner and A. D. Pelton, "Thermodynamic Modeling of the Fe—S System", J. Phase Equilib. Diff., Vol. 26, 1 (2005) 23.
14. J. G. Massey and M. Lee, "Direct Observation of the Coulomb Correlation Gap in a Nonmetallic Semiconductor, Si:B", Phys. Rev. Lett., 75, 23 (1995) 4266.
15. A. L. Efros and B. I. Shklovskii, "Coulomb gap and low temperature conductivity of disordered systems", J. Phys. C: Solid State Phys., 8 (1975) L49.

16. Kinder, H., Berberich, P., Prusseit, W., Rieder-Zecha, S., Semerad, R., and Utz, B., 1997, YBCO film deposition on very large areas up to 20×20 cm2: Physica C: Superconductivity.
17. B. H. Moeckly and W. S. Ruby, "Growth of high-quality large-area $MgB_2$ thin films by reactive evaporation", Supercond. Sci. Technol., 19 (2006) L21.
18. Berberich P, Utz B, Prusseit W, Kinder H. Physica C 1994; 497:504.
19. Moeckly B H, Ruby W S. Supercond Sci Technol 2006; L21:L24.
20. Findlay S D, Shibata N, Sawada H, Okunishi E, Kondo Y, Ikuhara Y. Ultramicroscopy 2010; 903:923.
21. Okunishi E, Sawasa H, Kondo Y. Micron 2012; 538:544.
22. Thomas B, Höpfner C, Ellmer K, Fiechter S, Tributsch H. J Cryst Growth 1995; 630:635.
23. Waldner P, Pelton A D. J Phase Equilib Diff 2005; 23:38.
24. Baker W W, Parks T C. Geochim Cosmochim Acta 1986; 2185:2194.
25. Toulmin P, Barton P B. Geochim Cosmochim Acta 1964; 641:671.
26. De las Heras C, Sanchez C. Thin Solid Films 1991; 259:267.
27. De las Heras C, Ferrer I J, Sanchez C. Appl Surf Sci 1991; 505:509.
28. De las Heras C, Martin de Vidales J L, Ferrer I J, Sanchez C. J Mater Res 1996; 211:220.
29. Meng L, Liu Y H, Huang W. Mater Sci Eng B 2002; 84:89.
30. Bausch S, Sailer B, Keppner H, Willeke G, Bucher E. Appl Phys Lett 1990; 25:27.
31. Ferrer I J, Caballero F, De las Heras C, Sanchez C. Solid State Commun 1994; 349:352.
32. Smestad G, Ennaoui A, Fiechter S, Tributsch H, Hofmann W K, Birkholz M. Sol Energy Mater Sol Cells 1990; 149:165.
33. Willeke G, Dasbach R, Sailer B, Bucher E. Thin Solid Films 1992; 271:276.
34. Bronold M, Kubala S, Pettenkofer C, Jaegermann W. Thin Solid Films 1997; 178:182.
35. Berry N, Cheng M, Perkins C L, Limpinsel M, Hemminger J C, Law M. Adv Energy Mater 2012; 1:12.
36. Schleich D M, Chang H S W. J Cryst Growth 1991; 737:744.
37. Thomas B, Höpfner C, Ellmer K, Fiechter S, Tributsch H. J Cryst Growth 1995; 630:635.
38. Massey J G, Lee M. Phys Rev Lett 1995; 4266:4269.
39. Efros A L, Shklovskii B I. J Phys C: Solid State Phys 1975; L49:L51.
40. Smestad G, Dasilva A, Tributsch H, Fiechter S, Kunst M, Meziani N, et al. Sol Energy Mater 1989; 299:313.
41. Meester B, Reijnen L, Goossens A, Schoonman J. Chem Vap Deposition 2000; 121:128.

What is claimed is:

1. A method for preparing a device having a film on a substrate, the method comprising:
   (a) providing a substrate;
   (b) maintaining a first pressure in a first chamber;
   (c) depositing a first element to form a thin film on the substrate in the first chamber;
   (d) maintaining a second pressure between 1 mTorr and 1 Torr in the second chamber;
   (e) depositing a second element over the film of the first element on the substrate in the second chamber, wherein the second element is a non-metal element and reacts with the first element in the film to form a thin film of a single phase pyrite semiconducting compound;
   (f) repeating steps (b) through (e) at least until the thin film of the semiconducting compound is formed on the substrate;
   wherein the second pressure is at least one order of magnitude greater than the first pressure; and
   wherein the deposition of the second element is conducted between 250° C. and 450° C.

2. The method of claim 1, wherein the substrate in step (a) is a silicon wafer.

3. The method of claim 1, wherein the first element is deposited by a method of molecular beam epitaxy.

4. The method of claim 1, wherein the second element is deposited by a method of molecular beam epitaxy.

5. The method of claim 1, wherein the second element is sulfur.

6. The method of claim 1, wherein pyrite is either single-crystalline or polycrystalline.

7. The method of claim 1, wherein the first and the second elements are deposited under an air-tight condition.

8. The method of claim 1, wherein the first pressure is less than $1.5 \times 10^{-5}$ Torr in step.

9. The method of claim 1, wherein the second pressure is greater than three orders of magnitude relative to the first pressure.

10. The method of claim 1, wherein the deposition of the first element is conducted between 250° C. and 450° C.

11. The method of claim 1, wherein the thin film of the semiconducting compound has a thickness larger than 25 nanometers.

12. The method of claim 1, wherein the thin film of the semiconducting compound epitaxially grows on the substrate.

* * * * *